United States Patent
Li et al.

(10) Patent No.: US 9,698,701 B2
(45) Date of Patent: Jul. 4, 2017

(54) POWER MODULE PACKAGING STRUCTURE AND METHOD FOR MANUFACTURING THE SAME

(71) Applicant: DELTA ELECTRONICS, INC., Taoyuan (TW)

(72) Inventors: Zeng Li, Taoyuan (TW); Jun-Cheng Lu, Taoyuan (TW); Tao Wang, Taoyuan (TW); Zheng-Fen Wan, Taoyuan (TW); Zhen-Qing Zhao, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/168,235

(22) Filed: May 30, 2016

(65) Prior Publication Data

US 2016/0352247 A1    Dec. 1, 2016

(30) Foreign Application Priority Data

Jun. 1, 2015 (CN) .......................... 2015 1 0292362
Jul. 15, 2015 (CN) .......................... 2015 1 0415558

(51) Int. Cl.
*H01L 23/495* (2006.01)
*H01L 21/50* (2006.01)
(Continued)

(52) U.S. Cl.
CPC ........ *H02M 7/003* (2013.01); *H01L 21/4846* (2013.01); *H01L 23/49833* (2013.01); *H01L 23/49838* (2013.01); *H01L 25/072* (2013.01); *H01L 25/18* (2013.01); *H01L 24/27* (2013.01); *H01L 24/29* (2013.01); *H01L 24/32* (2013.01); *H01L 24/48* (2013.01); *H01L 24/73* (2013.01);
(Continued)

(58) Field of Classification Search
CPC ............... H01L 25/072; H01L 21/4846; H01L 23/49838; H01L 24/32; H01L 24/48; H01L 24/83; H01L 24/85; H02M 7/003
USPC .......................................... 257/668; 438/125
See application file for complete search history.

(56) References Cited

U.S. PATENT DOCUMENTS 5,291,065 A * 3/1994 Arai .................... H01L 23/5385
                                                        257/691
5,466,969 A    11/1995 Tsunoda
(Continued)

FOREIGN PATENT DOCUMENTS

CN    103219397 A    7/2013
TW    538543 B    6/2003

*Primary Examiner* — Luan C Thai
(74) *Attorney, Agent, or Firm* — CKC & Partners Co., Ltd.

(57) ABSTRACT

A power module packaging structure includes a first conducting layer, a first insulating layer, a second conducting layer, a first power device, and a first controlling device. The first insulating layer is disposed above the first conducting layer. The second conducting layer is disposed above the first insulating layer. The first power device is disposed on the first conducting layer. The first controlling device is disposed on the second conducting layer and used for controlling the first power device. The first conducting layer, the second conducting layer, the first power device, and the first controlling device form a loop. A direction of a current which flows through the first conducting layer in the loop is opposite to a direction of a current which flows through the second conducting layer in the loop.

23 Claims, 12 Drawing Sheets

(51) Int. Cl.
*H02M 7/00* (2006.01)
*H01L 23/498* (2006.01)
*H01L 25/18* (2006.01)
*H01L 25/07* (2006.01)
*H01L 21/48* (2006.01)
*H01L 23/00* (2006.01)

(52) U.S. Cl.
CPC .............. *H01L 24/83* (2013.01); *H01L 24/85* (2013.01); *H01L 24/92* (2013.01); *H01L 2224/2732* (2013.01); *H01L 2224/291* (2013.01); *H01L 2224/293* (2013.01); *H01L 2224/29294* (2013.01); *H01L 2224/32225* (2013.01); *H01L 2224/32227* (2013.01); *H01L 2224/48091* (2013.01); *H01L 2224/48157* (2013.01); *H01L 2224/48227* (2013.01); *H01L 2224/73265* (2013.01); *H01L 2224/83192* (2013.01); *H01L 2224/83815* (2013.01); *H01L 2224/92247* (2013.01); *H01L 2924/00014* (2013.01); *H01L 2924/1203* (2013.01); *H01L 2924/13055* (2013.01); *H01L 2924/13091* (2013.01); *H01L 2924/19041* (2013.01); *H01L 2924/19043* (2013.01); *H01L 2924/19105* (2013.01); *H01L 2924/19107* (2013.01)

(56) References Cited

U.S. PATENT DOCUMENTS

| | | |
|---|---|---|
| 5,641,944 A | 6/1997 | Wieloch et al. |
| 5,703,399 A * | 12/1997 | Majumdar ............ H01L 21/565 257/675 |
| 7,345,461 B2 | 3/2008 | Horiguchi et al. |
| 7,800,224 B2 | 9/2010 | Lee et al. |
| 8,629,538 B2 | 1/2014 | Lee et al. |

* cited by examiner

POWER MODULE PACKAGING STRUCTURE AND METHOD FOR MANUFACTURING THE SAME

RELATED APPLICATIONS

This application claims priority to Chinese Application Serial Number 201510292362.7, filed Jun. 1, 2015, and Chinese Application Serial Number 201510415558.0, filed Jul. 15, 2015, which are herein incorporated by reference.

BACKGROUND

Field of Disclosure

The present disclosure relates to a packaging structure and a method for manufacturing the same. More particularly, the present disclosure relates to a power module packaging structure and a method for manufacturing the same.

Description of Related Art

In the power conversion area, power electronic devices serve as important parts to convert electric power efficiently. Hence, power electronic devices have been widely applied to electric power, electronics, electric motors, and energy industries. Enhancing the competitiveness of the above industries, stability, reliability, and energy conversion efficiency of the power electronics devices have always been goals that the industries are eager to pursue.

Furthermore, core components of the power electronic devices are power semiconductors. Thus, performances of the power semiconductors directly determine the stability, reliability, and energy conversion efficiency of the power electronic devices. To design a more reliable, safer, and high-performance power electronic device, the power semiconductor needs to be characterized by low voltage stress, low power loss, etc., correspondingly.

However, the current power semiconductors are often affected by parasitic inductances to generate higher voltage spikes in the power semiconductors, thus seriously impacting on performances of the power semiconductors and even the overall power electronic devices.

For the forgoing reasons, there is a need to solve the above-mentioned problems by providing a power module packaging structure and a method for manufacturing the same, which is also an objective that the industry is eager to achieve.

SUMMARY

A power module packaging structure is provided. The power module packaging structure comprises a first conducting layer, a first insulating layer, a second conducting layer, a first power device, and a first controlling device. The first insulating layer is disposed above the first conducting layer. The second conducting layer is disposed above the first insulating layer. The first power device is disposed on the first conducting layer. The first controlling device is disposed on the second conducting layer and used for controlling the first power device. The first conducting layer, the second conducting layer, the first power device, and the first controlling device form a loop. A direction of a current that flows through the first conducting layer in the loop is opposite to a direction of a current that flow through the second conducting layer in the loop.

The disclosure provides a manufacturing method for a power module packaging structure. The manufacturing method for the power module packaging structure comprises the steps of: forming a first conducting layer; forming a first insulating layer above the first conducting layer; forming a second conducting layer above the first insulating layer; forming a first power device on the first conducting layer; forming a first controlling device on the second conducting layer, the first controlling device being used for controlling the first power device; and making the first conducting layer, the second conducting layer, the first power device, and the first controlling device form a loop, a direction of a current that flows through the first conducting layer in the loop being opposite to a direction of a current that flows through the second conducting layer in the loop.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art.

As used herein, "couple" refers to direct physical contact or electrical contact or indirect physical contact or electrical contact between two or more elements. Or it can also refer to reciprocal operations or actions between two or more elements.

Numerous benefits are achieved by way of the present invention. For example, embodiments of the present invention provide an improved power module packaging structure reducing the parasitic inductance and improving upon the problem of higher voltage spike that occurs in the power semiconductor. These and other embodiments of the present disclosure, along with many of its advantages and features, are described in more detail in conjunction with the next below and attached figures.

Figure 1A:
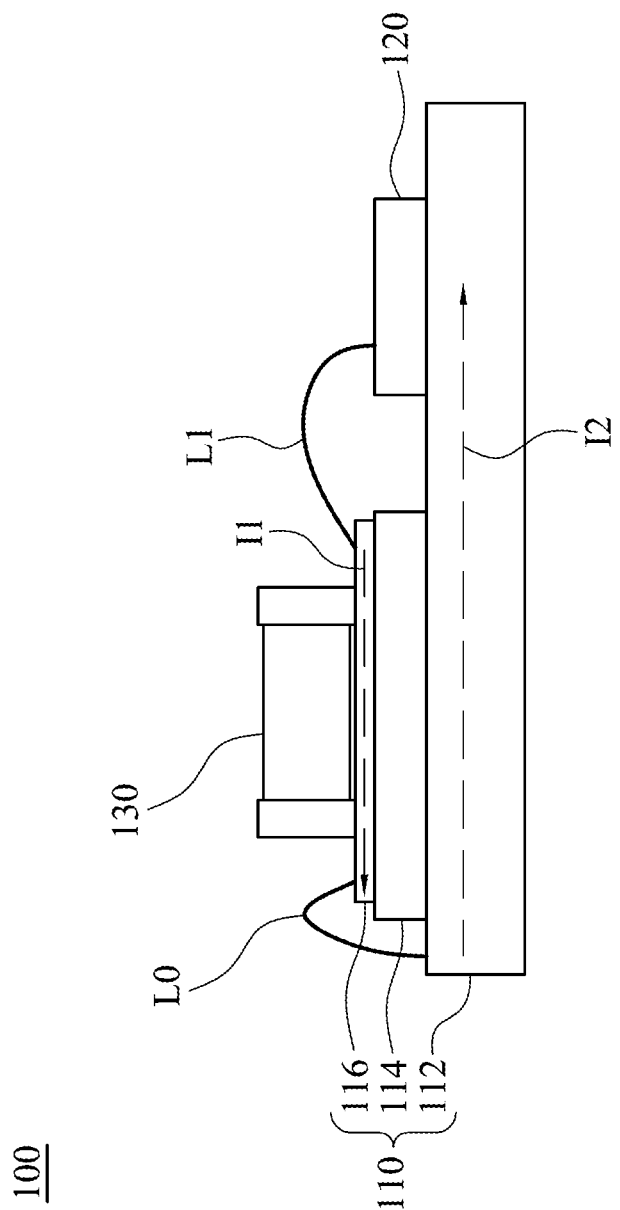
FIG. 1A depicts a schematic diagram of a power module packaging structure according to embodiments of this disclosure.

FIG. 1A depicts a schematic diagram of a power module packaging structure according to one embodiment of this disclosure. As shown in the figure, the power module packaging structure 100 comprises a first conducting layer 112, a first insulating layer 114, a second conducting layer 116, a first power device 120, and a first controlling device 130. In consideration of the structure, the first insulating layer 114 is disposed above the first conducting layer 112. The second conducting layer 116 is disposed above the first insulating layer 114. The first power device 120 is disposed on the first conducting layer 112. The first controlling device 130 is disposed on the second conducting layer 116.

In operations, the first controlling device 130 is used for controlling the first power device 120. Hence, the first conducting layer 112, the second conducting layer 116, the first power device 120, and the first controlling device 130 form a loop. A direction of a current 12 that flows through the first conducting layer 112 in the loop is opposite to a direction of a current 11 that flows through the second conducting layer 116 in the loop. As a result, the first conducting layer 112 and the second conducting layer 116 form reverse-coupling electromagnetic fields to reduce a parasitic inductance value between the first conducting layer 112 and the second conducting layer 116 so as to reduce the voltage spike which is generated in the power module packaging structure 100.

In another embodiment, a thickness of the first insulating layer 114 is 25 micrometers (um) to 1 millimeter (mm), which is not limited to this. The parasitic inductance between the first conducting layer 112 and the second conducting layer 116 is proportional to a distance between them. Since the first insulating layer 114 is disposed between the first conducting layer 112 and the second conducting layer 116, the distance between the first conducting layer 112 and the second conducting layer 116 is smaller if the thickness of the first insulating layer 114 is less. The parasitic inductance between the first conducting layer 112 and the second conducting layer 116 can thus be further reduced.

In still another embodiment, a ratio of an area of a vertical projection of the second conducting layer 116 onto the first conducting layer 112 to an area of the second conducting layer 116 is greater than 50%. In another embodiment, the ratio of the area of the vertical projection of the second conducting layer 116 onto the first conducting layer 112 to the area of the second conducting layer 116 is 100%. Since the direction of the current 12 flowing through the first conducting layer 112 is opposite to the direction of the current 11 flowing through the second conducting layer 116, reverse-coupling electromagnetic fields are thus formed between the first conducting layer 112 and the second conducting layer 116. The greater the ratio of the above area of the vertical projection to the area of the second conducting layer 116 is (for example, greater than 50%, preferably, the above ratio of area may be 100%), the larger the overlapped area of the vertical projection of the second conducting layer 116 onto the first conducting layer 112 and the second conducting layer 116 is. The parasitic inductance between the first conducting layer 112 and the second conducting layer 116 is thus further reduced to reduce the voltage spike which is generated in the power module packaging structure 100.

In yet another embodiment, the second conducting layer 116 is coupled to the first conducting layer 112 via a conducting member L0. In addition, the first power device 120 is coupled to the second conducting layer 116 via a connecting member L1. In another embodiment, the power module packaging structure 100 further comprises a substrate 110. The substrate 110 comprises the first conducting layer 112, the first insulating layer 114, and the second conducting layer 116.

Figure 1B:
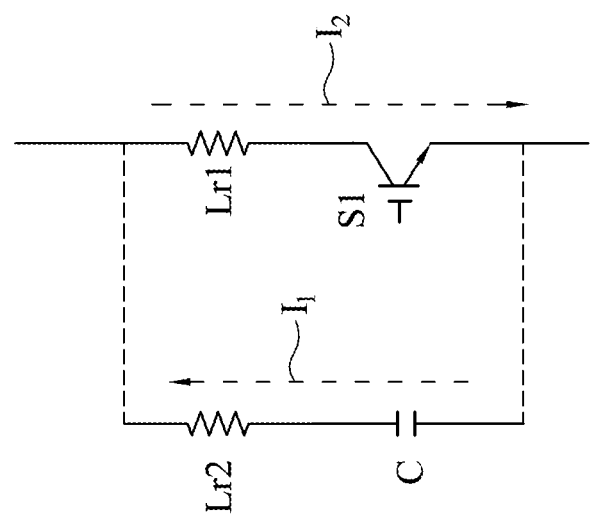
FIG. 1B depicts an equivalent circuit diagram of the power module packaging structure shown in FIG. 1A according to embodiments of this disclosure.

FIG. 1B depicts an equivalent circuit diagram of the power module packaging structure shown in FIG. 1A according to embodiments of this disclosure. As shown in the figure, the reference numeral S1 represents the first power device 120. The reference numeral C represents a capacitor device (since the capacitor device here is used for controlling the voltage spike across two terminals of the power device, it can be called the first controlling device 130). The reference numeral Lr1 represents a layout parasitic inductor of the first conducting layer 112. The reference numeral Lr2 represents a layout parasitic inductor of the second conducting layer 116. When the first power device 120 switches on or off, the voltage spike is generated across two terminals of the first power device 120. At this time, the capacitor device can reduce the voltage spike across the two terminals of the first power device 120, and the smaller the inductance values of the parasitic inductors Lr1 and Lr2 are, the lower the voltage spike is.

When practicing the present disclosure, the first power device 120 may be a power semiconductor device, such as an insulated gate bipolar transistor (IGBT), a metal-oxide-semiconductor field-effect transistor (MOSFET), or a diode, etc. The first controlling device 130, being a device that can be used for controlling the voltage spike across any two terminals of the first power device 120, may be a resistor, a capacitor, a semiconductor device, a chip, etc. However, the present disclosure is not limited in this regard, and those of ordinary skill in the art may adopt suitable electronic devices selectively depending on practical needs.

Figure 2:
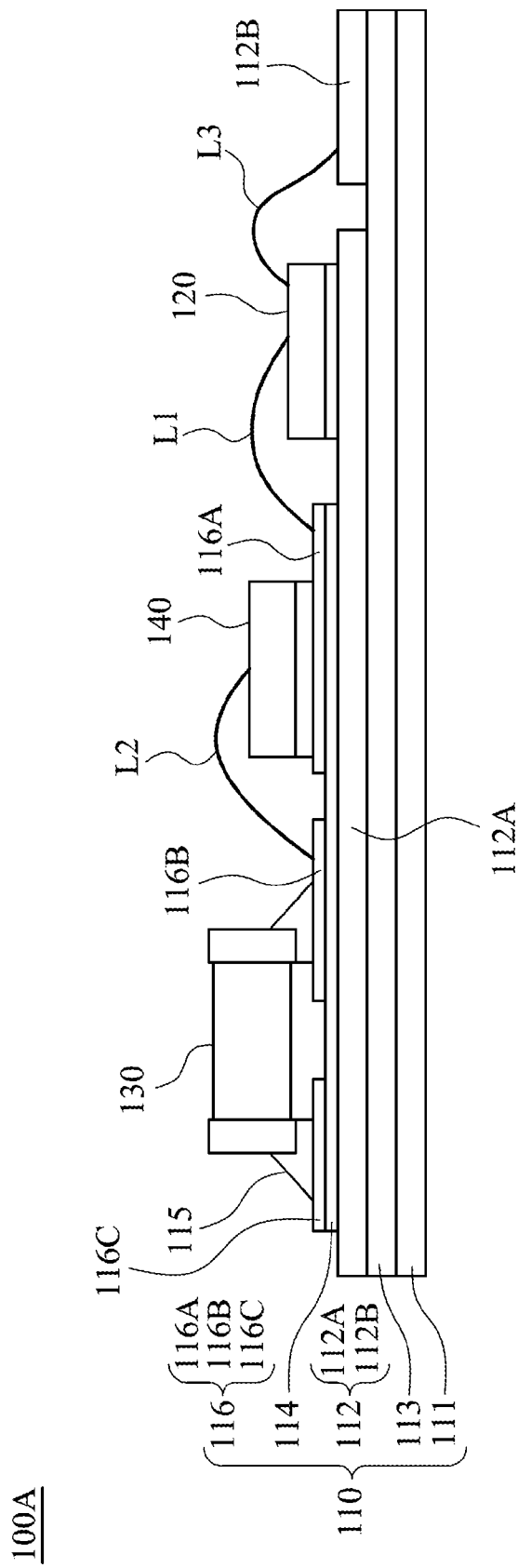
FIG. 2 depicts a schematic diagram of a power module packaging structure according to embodiments of this disclosure.

FIG. 2 depicts a schematic diagram of a power module packaging structure according to embodiments of this disclosure. As compared with the power module packaging structure 100 shown in FIG. 1A, the first conducting layer 112 of a power module packaging structure 100A shown in FIG. 2 comprises a first conducting portion 112A and a second conducting portion 112B. In consideration of the structure, the first conducting portion 112A and the second conducting portion 112B of the first conducting layer 112 are separate from each other, and the first power device 120 is disposed on the first conducting portion 112A of the first conducting layer 112.

In another embodiment, compared with the power module packaging structure 100 shown in FIG. 1A, the second conducting layer 116 of the power module packaging structure 100A shown in FIG. 2 comprises a first conducting portion 116A, a second conducting portion 116B, and a third conducting portion 116C. In consideration of the structure, the first conducting portion 116A, the second conducting portion 116B, and the third conducting portion 116C of the second conducting layer 116 are separate from one another, and two terminals of the first controlling device 130 are respectively disposed on the second conducting portion 116B and the third conducting portion 116C of the second conducting layer 116.

In still another embodiment, compared with the power module packaging structure 100 shown in FIG. 1A, the power module packaging structure 100A shown in FIG. 2 further comprises a second controlling device 140. In consideration of the structure, the second controlling device 140 is disposed on the first conducting portion 116A of the second conducting layer 116 and coupled to the second conducting portion 116B of the second conducting layer 116 via a connecting member L2. In addition, the substrate 110 of the power module packaging structure 100A shown in FIG. 2 further comprises a third conducting layer 111 and a second insulating layer 113. In consideration of the structure, the second insulating layer 113 is disposed on the third conducting layer 111. The first conducting layer 112 is disposed on the second insulating layer 113. The first power device 120 is coupled to the second conducting portion 112B of the first conducting layer 112 via a connecting member L3.

Figure 3:
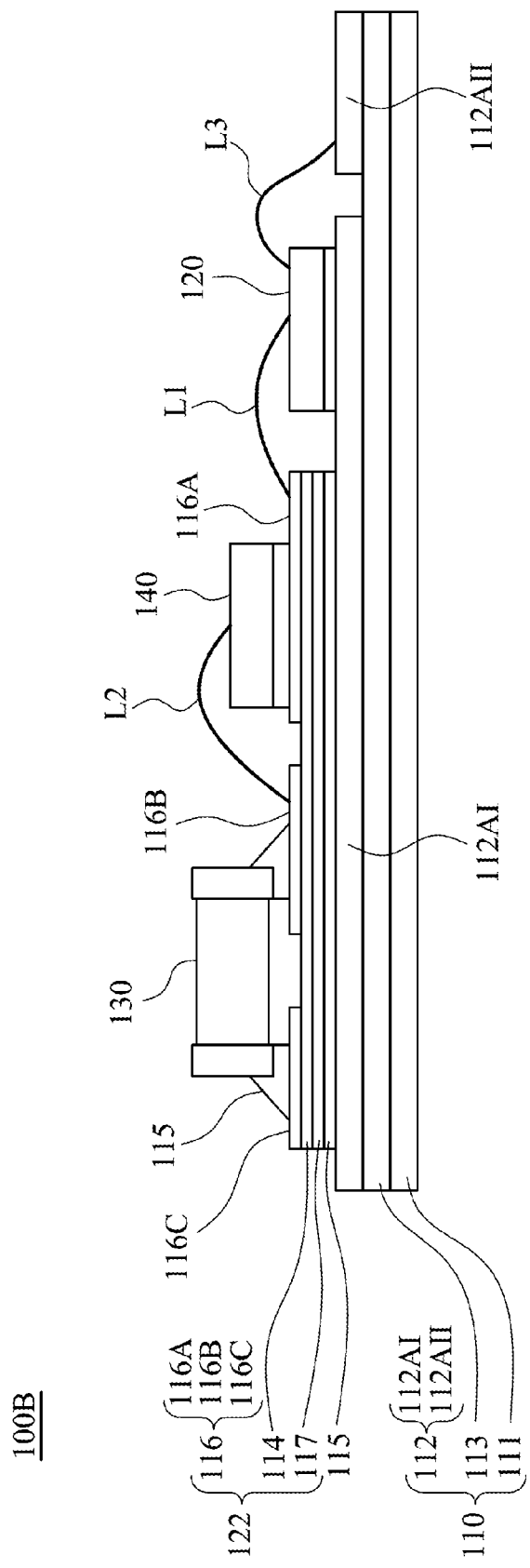
FIG. 3 depicts a schematic diagram of a power module packaging structure according to embodiments of this disclosure.

FIG. 3 depicts a schematic diagram of a power module packaging structure according to embodiments of this disclosure. As compared with the power module packaging structure 100 shown in FIG. 1A, a power module packaging structure 100B shown in FIG. 3 further comprises a first substrate 110 and a second substrate 122. The second substrate 122 is disposed above the first substrate 110. In another embodiment, the first substrate 110 comprises the first conducting layer 112. The second substrate 122 comprises the second conducting layer 116 and the first insulating layer 114. In still another embodiment, the first conducting layer 112 comprises a first conducting portion 112AI and a second conducting portion 112AII. In consideration of the structure, the first conducting portion 112AI and the second conducting portion 112AII of the first conducting layer 112 are separate from each other, and the first power device 120 is disposed on the first conducting portion 112AI of the first conducting layer 112 and coupled to the second conducting portion 112AII of the first conducting layer 112 via the connecting member L3. In yet another embodiment, the second conducting layer 116 comprises the first conducting portion 116A, the second conducting portion 116B, and the third conducting portion 116C. In consideration of the structure, the first conducting portion 116A, the second conducting portion 116B, and the third conducting portion 116C of the second conducting layer 116 are separate from one another, and the two terminals of the first controlling device 130 are respectively disposed on the second conducting portion 116B and the third conducting portion 116C of the second conducting layer 116.

In another embodiment, compared with the power module packaging structure 100 shown in FIG. 1A, the power module packaging structure 100B shown in FIG. 3 further comprises the second controlling device 140. In consideration of the structure, the second controlling device 140 is disposed on the first conducting portion 116A of the second conducting layer 116 and coupled to the second conducting portion 116B of the second conducting layer 116 via the connecting member L2. In still another embodiment, the first conducting portion 116A of the second conducting layer 116 is coupled to the first power device 120 via the connecting member L1.

In yet another embodiment, compared with the power module packaging structure 100 shown in FIG. 1A, in the power module packaging structure 100B shown in FIG. 3, the first substrate 110 further comprises the third conducting layer 111 and the second insulating layer 113, and the second substrate 122 further comprises a fourth conducting layer 117. In consideration of the structure, the second insulating layer 113 is disposed on the third conducting layer 111, and the first conducting layer 112 is disposed on the second insulating layer 113. The first insulating layer 114 is disposed on the fourth conducting layer 117. The fourth conducting layer 117 is connected to the first conducting layer 112 via conductive connection material 115.

Figure 4:
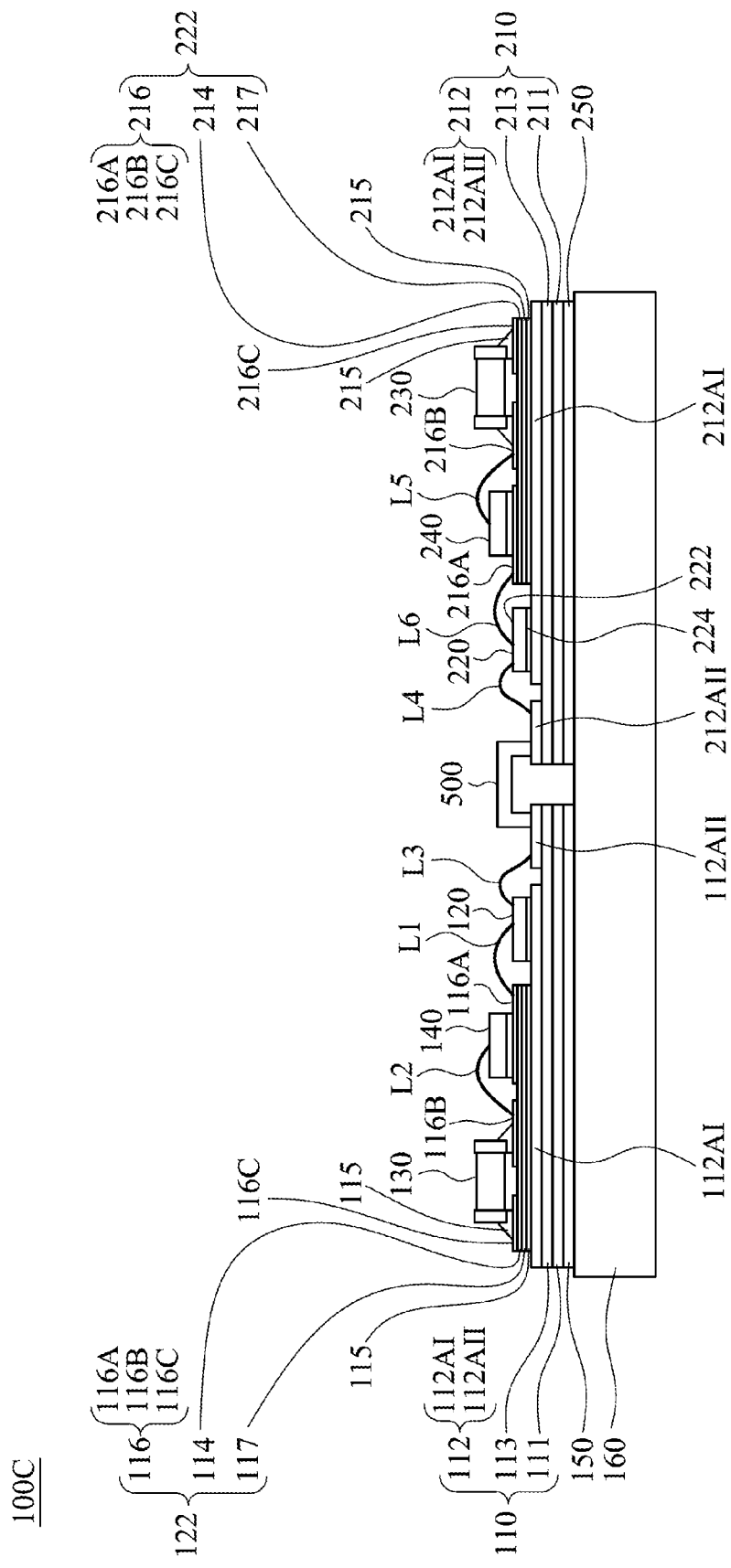
FIG. 4 depicts a schematic diagram of a power module packaging structure according to embodiments of this disclosure.

FIG. 4 depicts a schematic diagram of a power module packaging structure according to embodiments of this disclosure. The plurality of substrates which are the same as first substrates 110 and second substrates 122 can be adopted when power and volume of a power module are increased, as shown in FIG. 4. A power module packaging structure 100C shown in FIG. 4 comprises the two power module packaging structures 100B shown in FIG. 3, and the two power module packaging structures 100B are symmetrically disposed and connected by conductive connection material 500. In more detail, compared with the power module packaging structure 100B shown in FIG. 3, the power module packaging structure 100C further comprises a third substrate 210 and a fourth substrate 222 shown in FIG. 4, and the third substrate 210 and the fourth substrate 222 are connected via conductive connection material 215. The third substrate 210 has a same structure as the first substrate 110. The fourth substrate 222 has a same structure as the second substrate 122.

In another embodiment, the power module packaging structure 100C further comprises a substrate carrier 160. In consideration of the structure, the first substrate 110 and the second substrate 122 are disposed above the substrate carrier 160. The first substrate 110 is connected to the substrate carrier 160 via conductive connection material 150. The third substrate 210 and the fourth substrate 222 are disposed above the substrate carrier 160. The third substrate 210 is connected to the substrate carrier 160 via conductive connection material 250. In addition, the first substrate 110 and the third substrate 210 are connected via the conductive connection material 500. In another embodiment, the first controlling device 130 may be a capacitor, a diode clamping circuit, or an active clamping circuit. However, the present disclosure is not limited in this regard, and those of ordinary skill in the art may adopt suitable electronic devices selectively depending on practical needs.

A description is provided with reference to FIG. 4. In another embodiment, the power module packaging structure 100C may be manufactured by using the following processes: printing solder paste on the second conducting layer 116 to attach the first controlling device 130 and the second controlling device 140 to the second conducting layer 116, and soldering the first controlling device 130 and the second controlling device 140 to the second conducting layer 116 through reflow soldering; printing solder paste on the first substrate 110 and soldering the fourth conducting layer 117 and the first power device 120 to the first substrate 110 through reflow soldering; coupling the second controlling device 140 to the second conducting layer 116 and coupling the first power device 120 to the second conducting layer 116 via several connecting members L1, L2 (it is noted that the manufacturing method of the structure on the right side of the power module packaging structure is similar to the manufacturing method of the structure on the left side of the power module packaging structure. So a description is not provided in order to make the specification concise for the right side of the power module packaging structure); printing a solder material on the substrate carrier 160, fixing the first substrate 110 and the third substrate 210 to the substrate carrier 160 by using a jig (not shown in the figure), and soldering the first substrate 110, the third substrate 210 and main power input/output terminals (not shown in the figure) to the substrate carrier 160 through reflow soldering; and connecting the first substrate 110 and the third substrate 210 via conductive connection material 500, in more detail, connecting the first conducting layer 112 and the fourth conducting layer 212 via the conductive connection material 500. Finally, sealant is dipped in a periphery of the substrate carrier 160 to mount a casing. An insulating compound is poured into and seals the casing. Main power input/output terminals are mechanically bent to complete the whole module packaging process (not shown in the figure).

Figure 5A:
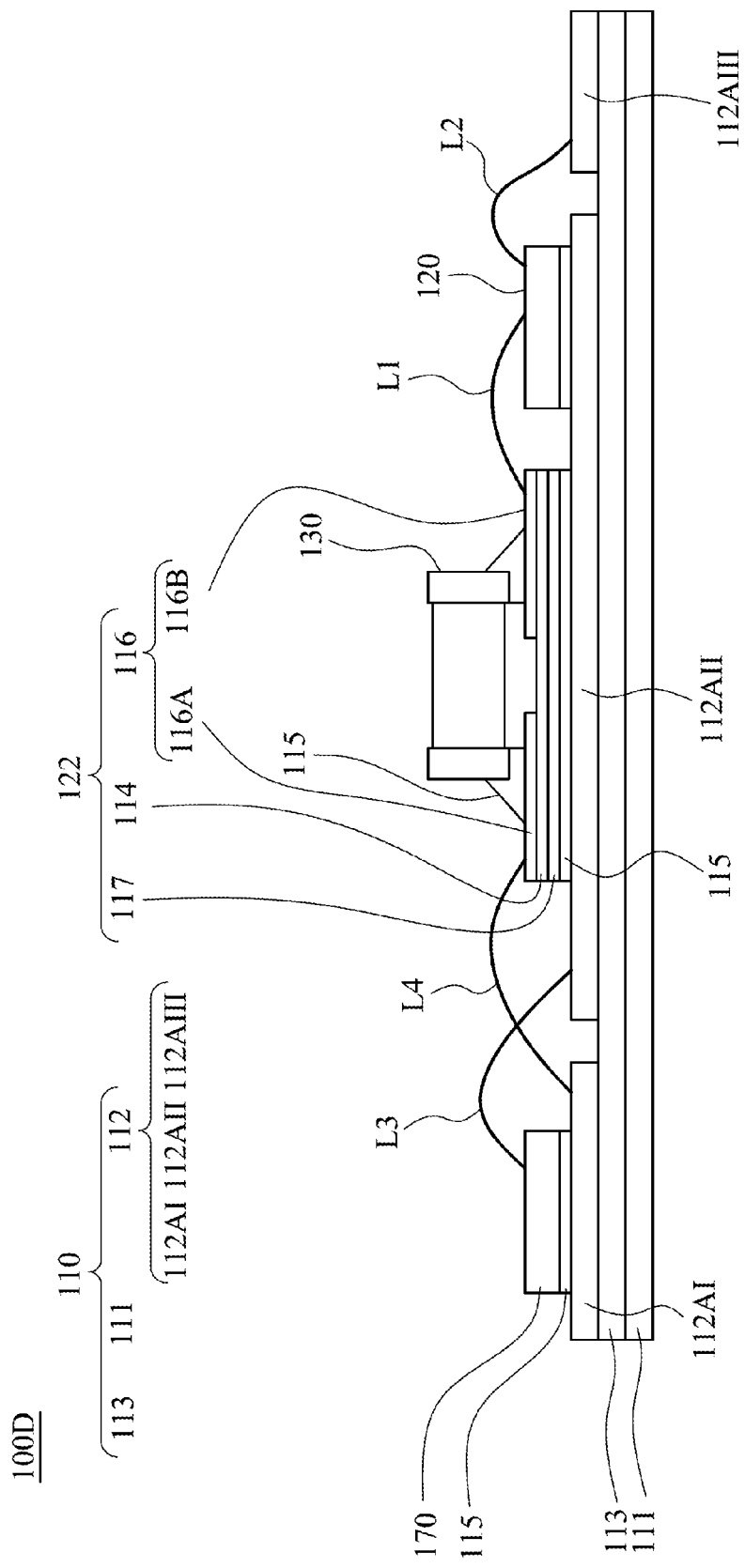
FIG. 5A depicts a schematic diagram of a power module packaging structure according to embodiments of this disclosure.

FIG. 5A depicts a schematic diagram of a power module packaging structure according to embodiments of this disclosure. As compared with the power module packaging structure 100 shown in FIG. 1A, the first conducting layer 112 of a power module packaging structure 100D shown in FIG. 5A comprises the first conducting portion 112AI, the second conducting portion 112AII, and a third conducting portion 112AIII. The first conducting portion 112AI, the second conducting portion 112AII, and the third conducting portion 112AIII of the first conducting layer 112 are separate from one another.

In another embodiment, as compared with the power module packaging structure 100 shown in FIG. 1A, a power device 170 of the power module packaging structure 100D shown in FIG. 5A is disposed on the first conducting portion 112AI of the first conducting layer 112 and coupled to the second conducting portion 112AII of the first conducting layer 112 via the connecting member L3. In still another embodiment, as compared with the power module packaging structure 100 shown in FIG. 1A, the power module packaging structure 100D shown in FIG. 5A further comprises the first power device 120 disposed on the second conducting portion 112AII of the first conducting layer 112 and coupled to the third conducting portion 112AIII of the first conducting layer 112 via the connecting member L2.

In yet another embodiment, as compared with the power module packaging structure 100 shown in FIG. 1A, the second conducting layer 116 of the power module packaging structure 100D shown in FIG. 5A comprises the first conducting portion 116A and the second conducting portion 116B. The first conducting portion 116A and the second conducting portion 116B of the second conducting layer 116 are separate from each other, and the two terminals of the first controlling device 130 are disposed on the first conducting portion 116A and the second conducting portion 116B of the second conducting layer 116 respectively. In another embodiment, as compared with the power module packaging structure 100 shown in FIG. 1A, the first conducting portion 116A of the second conducting layer 116 is coupled to the first conducting portion 112AI of the first conducting layer 112 via a connecting member L4 in the power module packaging structure 100D shown in FIG. 5A.

Figure 5B:
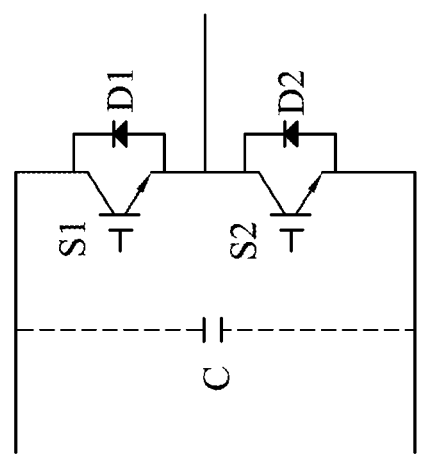
FIG. 5B depicts an equivalent circuit diagram of the power module packaging structure shown in FIG. 5A according to embodiments of this disclosure.

FIG. 5B depicts an equivalent circuit diagram of the power module packaging structure shown in FIG. 5A according to embodiments of this disclosure. As shown in the figure, generally speaking, insulated gate bipolar transistors S1, S2 and diodes D1, D2 are disposed on the first conducting layer 112. In more detail, the insulated gate bipolar transistor S1 and the diode D1 may be disposed on a block where the power device 170 is located. The insulated gate bipolar transistor S2 and the diode D2 may be disposed on a block where the power device 120 is located. The reference numeral C represents a capacitor device (since the capacitor device here is used for controlling the voltage spike across two terminals of the power device, it can be the first controlling device 130). The insulated gate bipolar transistors S1, S2, the diodes D1, D2, and the capacitor device C form a loop. A direction of a current that flows through the first conducting layer 112 in the loop is opposite to a direction of a current that flows through the second conducting layer 116 in the loop. As a result, a parasitic inductance in the loop can be reduced. The capacitor device C that serves as the controlling device is able to reduce the voltage spike between the insulated gate bipolar transistor S1 and the insulated gate bipolar transistor S2 during the switch-on/off process. When the insulated gate bipolar transistor S1 is turned on and the insulated gate bipolar transistor S2 is turned off, the capacitor device C is used for reducing a voltage between a collector and an emitter of the insulated gate bipolar transistor S2. When the insulated gate bipolar transistor S2 is turned on and the insulated gate bipolar transistor S1 is turned off, the capacitor device C is used for reducing a voltage between a collector and an emitter of the insulated gate bipolar transistor S1.

Figure 5C:
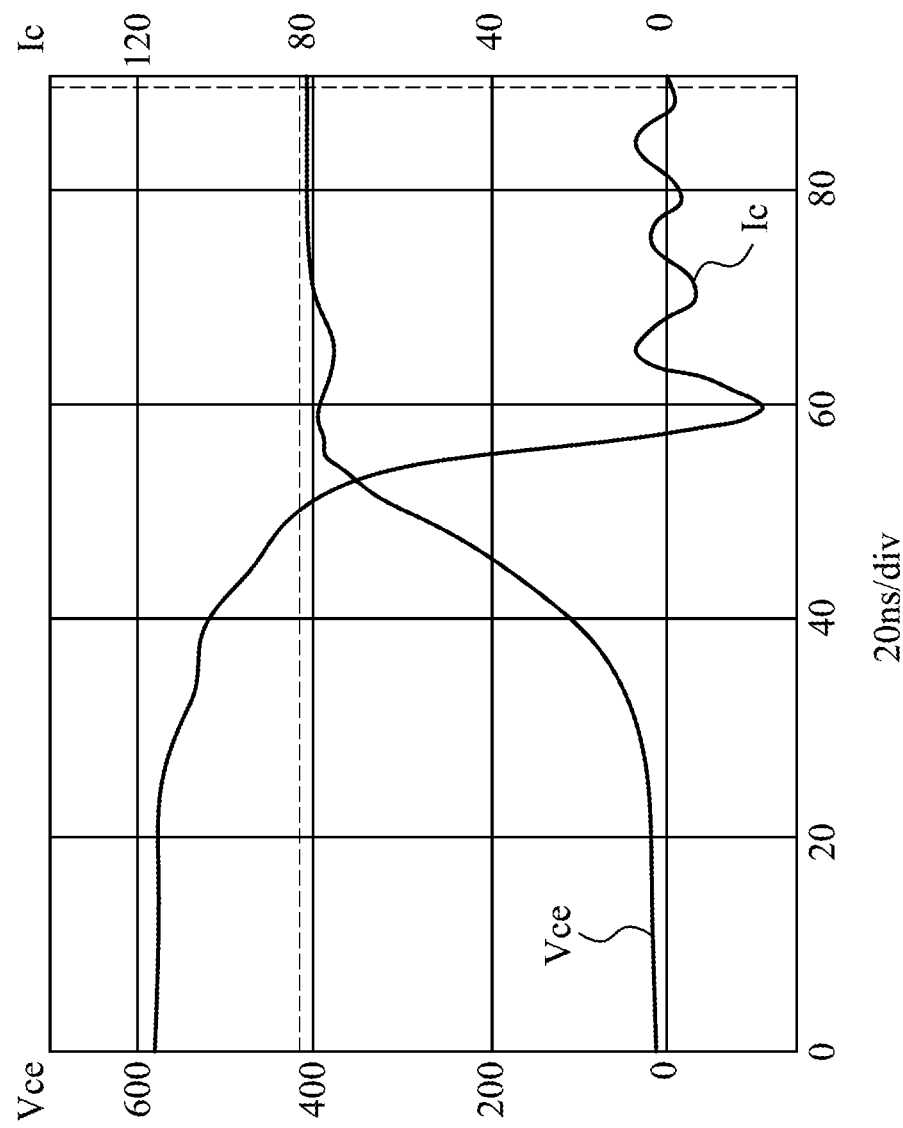
FIG. 5C depicts an experimental data diagram of the power module packaging structure shown in FIG. 5A according to embodiments of this disclosure.

FIG. 5C depicts an experimental data diagram of the power module packaging structure shown in FIG. 5A according to embodiments of this disclosure. As shown in the diagram, the reference numeral Ic represents the collector current of the power device 170. The reference numeral Vice represents the collector-emitter voltage of the power device 170. As can be seen from the waveform shown in the figure, the spike of the collector-emitter voltage is lower than 40 volts (V) under the circumstances that the change rate of the collector current di/dt is greater than 20000 A/us. The spike of the collector-emitter voltage of the prior art power module usually exceeds 100V under the circumstances of the same change rate of the current. It is thus understood that the power module packaging structure according to the present embodiment greatly reduces the voltage spike of the power semiconductor device.

Figure 6A:
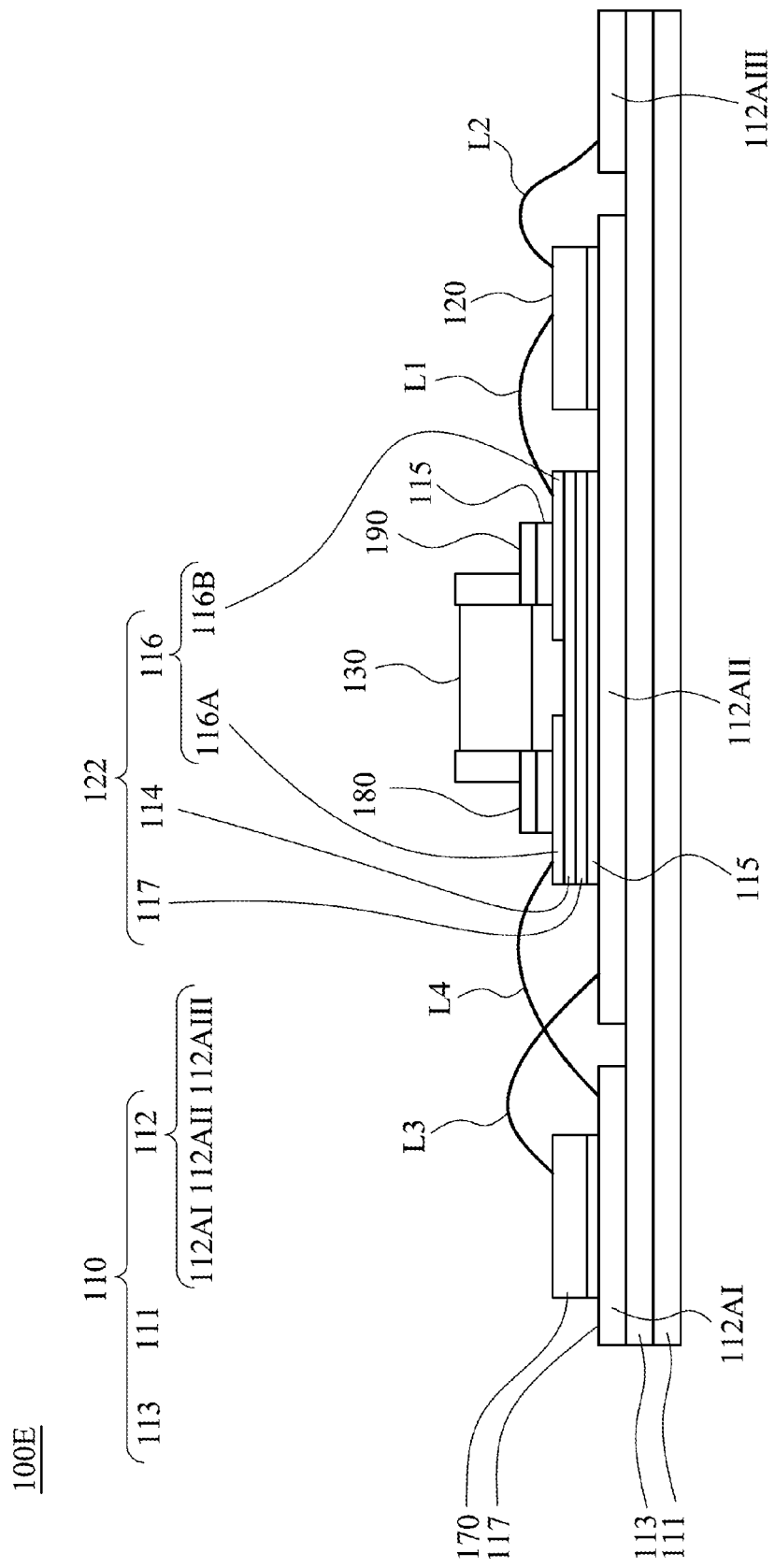
FIG. 6A depicts a schematic diagram of a power module packaging structure according to embodiments of this disclosure.

FIG. 6A depicts a schematic diagram of a power module packaging structure according to embodiments of this disclosure. As compared with the power module packaging structure 100D shown in FIG. 5A, a power module packaging structure 100E shown in FIG. 6A further comprises a first driving circuit 180 and a second driving circuit 190. In consideration of the structure, the first driving circuit 180 is disposed on the first conducting portion 116A of the second conducting layer 116 and is independent of the first controlling device 130. In addition, the second driving circuit 190 is disposed on the second conducting portion 116B of the second conducting layer 116 and is independent of the first controlling device 130.

Figure 6B:
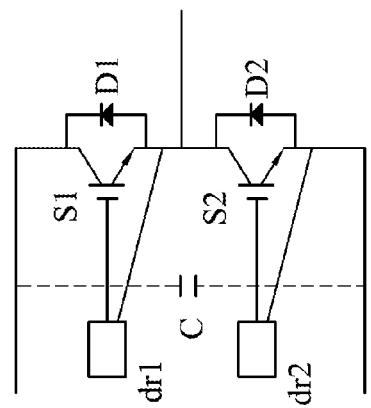
FIG. 6B depicts an equivalent circuit diagram of the power module packaging structure shown in FIG. 6A according to embodiments of this disclosure.

FIG. 6B depicts an equivalent circuit diagram of the power module packaging structure shown in FIG. 6A according to embodiments of this disclosure. As compared with the equivalent circuit diagram of the power module packaging structure 100D shown in FIG. 5B, the equivalent circuit diagram of the power module packaging structure 100E shown in FIG. 6B further comprises driving circuits dr1 and dr2 (respectively correspond to the first driving circuit 180 and the second driving circuit 190 shown in FIG. 6A).

Figure 7:
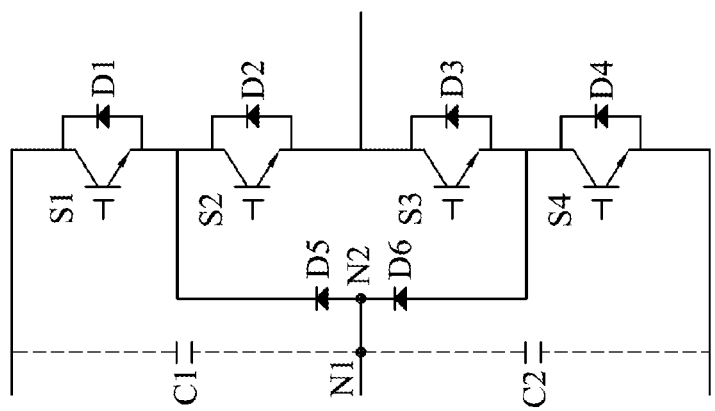
FIG. 7 depicts a schematic diagram of an equivalent circuit of a power module packaging structure according to embodiments of this disclosure.

FIG. 7 depicts a schematic diagram of an equivalent circuit of a power module packaging structure according to still another embodiment of this disclosure. As shown in the figure, a D-type three-level power circuit having absorbing capacitors is depicted. In consideration of the structure, insulated gate bipolar transistors S1-S4 are respectively connected in parallel with diodes D1-D4, and then are connected in series with one another to form a serial arm. The serial arm is connected in parallel with an arm formed by connecting capacitors C1 and C2 in series. Diodes D5 and D6 are connected in series, and then are connected in parallel with an arm formed by connecting the insulated gate bipolar transistors S2 and S3 in series. A common terminal N1 of the serially connected capacitors C1 and C2 is connected to a common terminal N2 of the serially connected diodes D5 and D6.

By adopting the above packaging structure, the capacitors C1 and C2 are disposed on the second conducting layer 116 and the power semiconductor devices (the insulated gate bipolar transistors S1-S4, the diodes D1-D6) are disposed on the first conducting layer 112. A packaging parasitic inductance of a converter loop constituted by the insulated gate bipolar transistor S1, the diode D5, and the capacitor C1 is greatly reduced, as the capacitor C1 that serves as the controlling device is able to reduce the voltage spike between the insulated gate bipolar transistor S1 and the diode D5 during the switch-on/off process. When the insulated gate bipolar transistor S1 is turned on and the diode D5 is blocked, the capacitor C1 is used for reducing a voltage between two electrodes of the diode D5. When the diode D5 is conducted and the insulated gate bipolar transistor S1 is turned off, the capacitor C1 is used for reducing a voltage between a collector and an emitter of the insulated gate bipolar transistor S1.

In addition, the above structural configuration can also reduce a packaging parasitic inductance of a converter loop constituted by the insulated gate bipolar transistor S4, the diode D6, and the capacitor C2 at the same time, as the capacitor C2 that serves as the controlling device is able to reduce the voltage spike between the insulated gate bipolar transistor S4 and the diode D6. When the insulated gate bipolar transistor S4 is turned on and the diode D6 is blocked, the capacitor C2 is used for reducing a voltage between two electrodes of the diode D6. When the diode D6 is conducted and the insulated gate bipolar transistor S4 is turned off, the capacitor C2 is used for reducing a voltage between a collector and an emitter of the insulated gate bipolar transistor S4.

Figure 8:
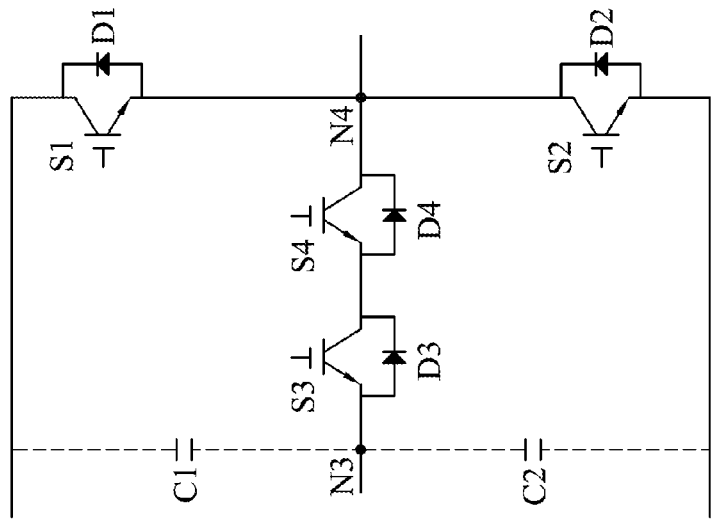
FIG. 8 depicts a schematic diagram of an equivalent circuit of a power module packaging structure according to embodiments of this disclosure.

FIG. 8 depicts a schematic diagram of an equivalent circuit of a power module packaging structure according to yet another embodiment of this disclosure. As shown in the figure, a T-type three-level power circuit having absorbing capacitors is depicted. In consideration of the structure, insulated gate bipolar transistors S1 and S2 are respectively connected in parallel with diodes D1 and D2, and then are connected in series with each other to form a serial arm. The serial arm is connected in parallel with an arm formed by connecting capacitors C1 and C2 in series. Insulated gate bipolar transistors S3 and S4 are respectively connected in parallel with diodes D3 and D4, and then are connected in series with each other to form a serial arm. The serial arm is connected between a common terminal N3 of the serially connected capacitors C1 and C2 and a common terminal N4 of the serially connected insulated gate bipolar transistors S1 and S2.

By adopting the above packaging structure, the capacitors C1 and C2 are disposed on the second conducting layer 116 and the power semiconductor devices (the insulated gate bipolar transistors S1-S4, the diodes D1-D6) are disposed on the first conducting layer 112. A packaging parasitic inductance of a converter loop constituted by the insulated gate bipolar transistors S1, S4, the diode D3, and the capacitor C1 is greatly reduced, and a packaging parasitic inductance of a converter loop constituted by the insulated gate bipolar transistors S2, S3, the diode D4, and the capacitor C2 is also greatly reduced.

Figure 9:
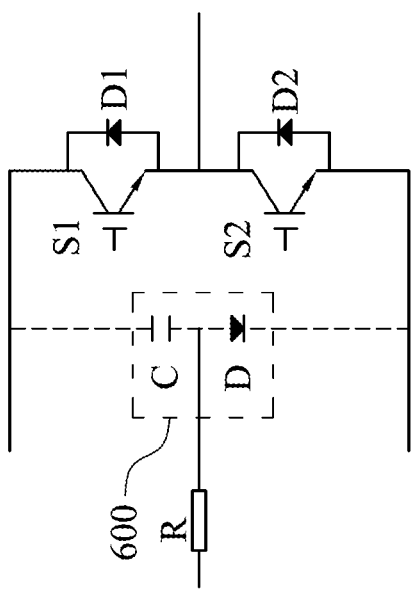
FIG. 9 depicts a schematic diagram of an equivalent circuit of a power module packaging structure according to embodiments of this disclosure.

FIG. 9 depicts a schematic diagram of an equivalent circuit of a power module packaging structure according to embodiments of this disclosure. In one embodiment, the control circuit disposed on the second conducting layer 116 may adopt a diode clamping circuit. As shown in the figure, a half-bridge power circuit having a diode clamping circuit is depicted, in which circuit connection is the same as that of the half-bridge power circuit shown in FIG. 5B and only the capacitor C is replaced by a diode clamping circuit 600. Since a connection method between the diode clamping circuit 600 and the external is similar to that shown in FIG. 5B, a description in this regard is not provided. In the diode clamping circuit 600, the reference numeral C represents a capacitor. The reference numeral D represents a diode. The reference numeral R represents an absorbing resistor. One terminal of the capacitor C is connected to an anode of the diode D and one terminal of the resistor R. In addition, another terminal of the capacitor C, a cathode of the diode D, and another terminal of the resistor R are connected to an external circuit. Additionally, the capacitor C and the diode D are disposed on the second conducting layer 116. The resistor R is disposed outside the power module and is connected to the second conducting layer 116 via a pin or a bonding wire. But it is noted that the resistor R can be disposed inside the power module according to the practical application.

Figure 10:
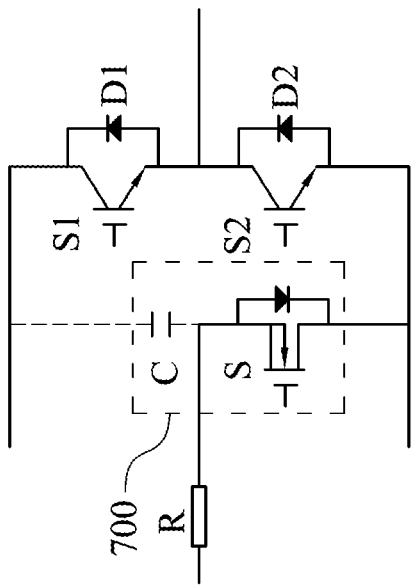
FIG. 10 depicts a schematic diagram of an equivalent circuit of a power module packaging structure according to embodiments of this disclosure.

FIG. 10 depicts a schematic diagram of an equivalent circuit of a power module packaging structure according to embodiments of this disclosure. In one embodiment, the absorbing circuit disposed on the second conducting layer 116 may adopt an active clamping circuit. As shown in the figure, a half-bridge power circuit having an active clamping circuit is depicted, in which circuit connection is the same as that of the half-bridge power circuit shown in FIG. 5B and only the capacitor C is replaced by an active clamping circuit 700. Since a connection method between the active clamping circuit 700 and the external is similar to that shown in FIG. 5B, a description in this regard is not provided. In the active clamping circuit 700, the reference numeral C represents a capacitor. The reference numeral S represents a power semiconductor. The reference numeral R represents an absorbing resistor. One terminal of the capacitor C is connected to a collector of the power semiconductor S and one terminal of the resistor R. In addition, another terminal of the capacitor C, an emitter and a base of the power semiconductor S, and another terminal of the resistor R are connected to an external circuit. Additionally, the capacitor C and the power semiconductor S are disposed on the second conducting layer 116. The resistor R is disposed outside the power module and is connected to the second conducting layer 116 via a pin or a bonding wire.

Figure 11:
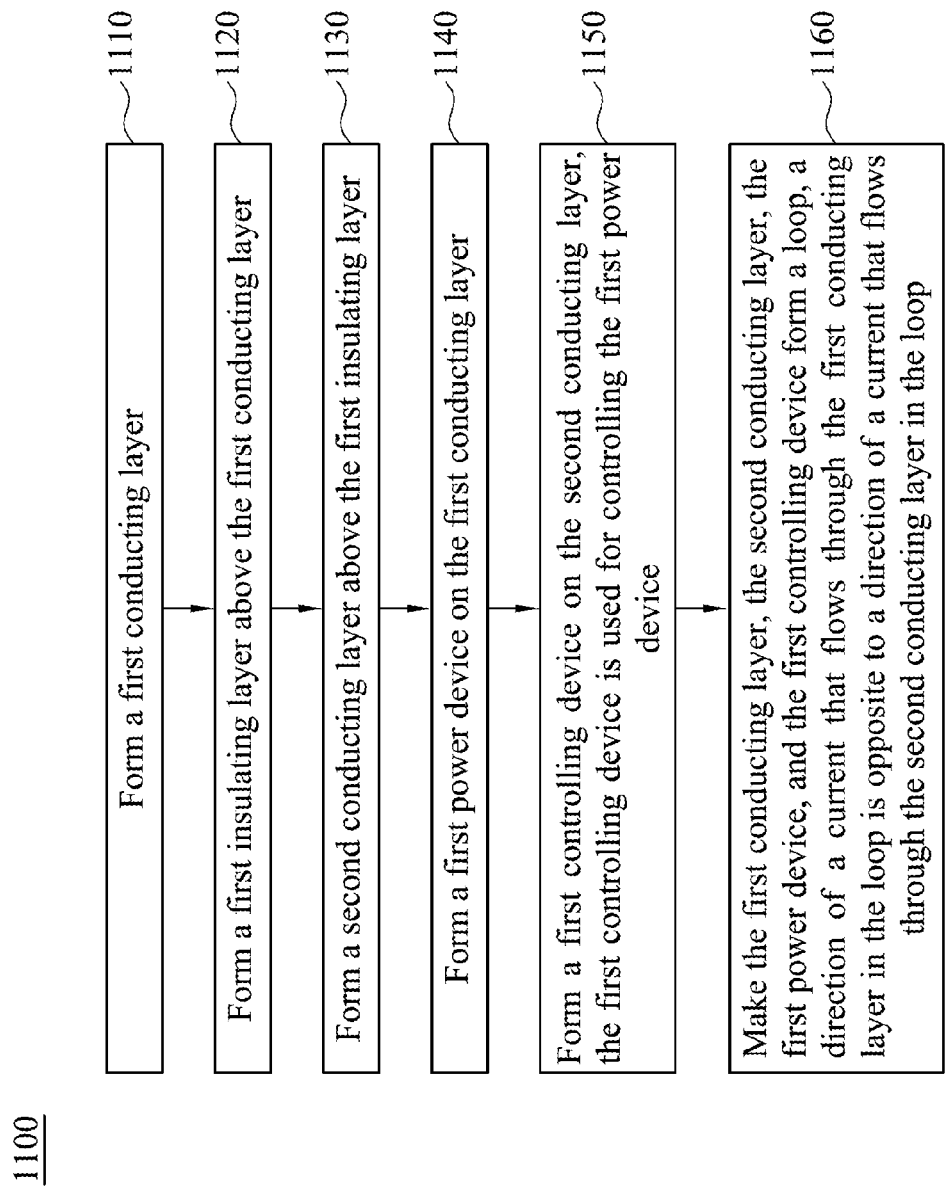
FIG. 11 depicts a flowchart of a manufacturing method for a power module packaging structure according to embodiments of this disclosure.

FIG. 11 depicts a flowchart of a manufacturing method for a power module packaging structure according to yet another embodiment of this disclosure. As shown in the figure, the manufacturing method 1100 for the power module packaging structure comprises:

Step 1110: forming a first conducting layer;

Step 1120: forming a first insulating layer above the first conducting layer;

Step 1130: forming a second conducting layer above the first insulating layer;

Step 1140: forming a first power device on the first conducting layer;

Step 1150: forming a first controlling device on the second conducting layer, wherein the first controlling device is used for controlling the first power device; and Step 1160: making the first conducting layer, the second conducting layer, the first power device, and the first controlling device form a loop, wherein a direction of a current that flows through the first conducting layer in the loop is opposite to a direction of a current that flows through the second conducting layer in the loop.

In order to facilitate the understanding of the manufacturing method 1100 for the power module packaging structure according to embodiment of the present disclosure, a description is provided with reference to FIG. 1A ad FIG. 11. In Step 1110, the first conducting layer 112 is formed. In Step 1120, the first insulating layer 114 is formed above the first conducting layer 112. In Step 1130, the second conducting layer 116 is formed above the first insulating layer 114. In Step 1140, the first power device 120 is formed on the first conducting layer 112. In Step 1150, the first controlling device 130 is formed on the second conducting layer 116. The first controlling device 130 is used for controlling the first power device 120. In Step 1160, a loop is formed by the first conducting layer 112, the second conducting layer 114, the first power device 120, and the first controlling device 130. The direction of the current I2 that flows through the first conducting layer 112 in the loop is opposite to the direction of the current I1 that flows through the second conducting layer 116 in the loop. Therefore, the first conducting layer 112 and the second conducting layer 116 manufactured by the manufacturing method 1100 form reverse-coupling electromagnetic fields to reduce the parasitic inductance between the first conducting layer 112 and the second conducting layer 116 so as to reduce the voltage spike which is generated in the power module packaging structure 100.

In another embodiment, the thickness of the first insulating layer 114 manufactured by the manufacturing method 1100 is approximately 25 micrometers (um) to 1 millimeter (mm). The parasitic inductance between the first conducting layer 112 and the second conducting layer 116 is proportional to the distance between them. Since the first insulating layer 114 is disposed between the first conducting layer 112 and the second conducting layer 116, the distance between the first conducting layer 112 and the second conducting layer 116 is smaller if the thickness of the first insulating layer 114 is less. The parasitic inductance between the first conducting layer 112 and the second conducting layer 116 can thus be further reduced.

In still another embodiment, through the above manufacturing method 1100, the ratio of the area of the vertical projection of the second conducting layer 116 onto the first conducting layer 112 to the area of the second conducting layer 116 can be greater than 50%. In another embodiment, through the above manufacturing method 1100, the ratio of the area of the vertical projection of the second conducting layer 116 onto the first conducting layer 112 to the area of the second conducting layer 116 can be 100%. Since the direction of the current I2 flowing through the first conducting layer 112 is opposite to the direction of the current I1 flowing through the second conducting layer 116, reverse-coupling electromagnetic fields are thus formed between the first conducting layer 112 and the second conducting layer 116. The ratio of the above area of the vertical projection to the area of the second conducting layer 116 is greater than 50%, preferably, the above ratio of area may be 100%. As a result, the parasitic inductance between the first conducting layer 112 and the second conducting layer 116 can be further reduced to reduce the voltage spike which is generated in the power module packaging structure 100 manufactured by the manufacturing method 1100.

In yet another embodiment, the above manufacturing method 1100 further comprises: coupling the first conducting layer 112 to the second conducting layer 116 via the conducting wire L0. In addition, the manufacturing method 1100 further comprises: coupling the second conducting layer 116 to the first power device 120 via the connecting member L1. In another embodiment, the manufacturing method 1100 further comprises: forming the substrate 110, wherein the substrate 110 comprises the first conducting layer 112, the first insulating layer 114, and the second conducting layer 116.

A description is provided with reference to FIG. 2 and FIG. 11. The step of forming the first conducting layer 112 comprises: forming the first conducting portion 112A and the second conducting portion 112B of the first conducting layer 112, wherein the first conducting portion 112A and the second conducting portion 112B of the first conducting layer 112 are separate from each other. In addition, the step of forming the first power device 120 on the first conducting layer 112 comprises: forming the first power device 120 on the first conducting portion 112A of the first conducting layer 112.

In another embodiment, the step of forming the second conducting layer 116 comprises: forming the first conducting portion 116A, the second conducting portion 116B, and the third conducting portion 116C of the second conducting layer 116, wherein the first conducting portion 116A, the second conducting portion 116B, and the third conducting portion 116C of the second conducting layer 116 are separate from one another. In addition, the manufacturing method 1100 further comprises: disposing the two terminals of the first controlling device 130 on the second conducting portion 116B and the third conducting portion 116C of the second conducting layer 116, respectively.

In still another embodiment, the above manufacturing method 1100 further comprises: forming the second controlling device 140 on the first conducting portion 116A of the second conducting layer 116, and coupling the second controlling device 140 to the second conducting portion 116B of the second conducting layer 116 via the connecting member L2. In addition, the manufacturing method 1100 further comprises: forming the third conducting layer 111, and forming the second insulating layer on the third conducting layer 111, wherein the second conducting portion 112B of the first conducting layer 112 being formed on the second insulating layer 113, and the first power device 120 is coupled to the second conducting portion 112B of the first conducting layer 112 via the connecting member L3.

In order to facilitate the understanding of the manufacturing method 1100 for the power module packaging structure according to embodiment of the present disclosure, a description is provided with reference to FIG. 3. The above manufacturing method 1100 further comprises: forming the first substrate 110, the first substrate 110 comprising the first conducting layer 112; and forming the second substrate 122 above the first substrate 110. The second substrate 122 comprises the second conducting layer 116 and the first insulating layer 114. A description is provided with reference to FIG. 3 and FIG. 11. In still another embodiment, the step of forming the first conducting layer 112 comprises: forming the first conducting portion 112AI and a second conducting portion 112AII of the first conducting layer 112, and the first conducting portion 112AI and the second conducting portion 112AII of the first conducting layer 112 are separate from each other. In addition, the step of forming the first power device 120 on the first conducting layer 112 comprises: forming the first power device 120 on the first conducting portion 112AI of the first conducting layer 112, and coupling the first power device 120 to the second conducting portion 112AII of the first conducting layer 112 via the connecting member L3. In yet another embodiment, the step of forming the second conducting layer 116 comprises: forming the first conducting portion 116A, the second conducting portion 116B, and the third conducting portion 116C of the second conducting layer 116, and the first conducting portion 116A, the second conducting portion 116B, and the third conducting portion 116C of the second conducting layer 116 are separate from one another. In addition, the manufacturing method 1100 further comprises: disposing the two terminals of the first controlling device 130 on the second conducting portion 116B and the third conducting portion 116C of the second conducting layer 116, respectively.

In another embodiment, the above manufacturing method 1100 further comprises: forming the second controlling device 140 on the first conducting portion 116A of the second conducting layer 116, wherein the second controlling device 140 is coupled to the second conducting portion 116B of the second conducting layer 116 via the connecting member L2. In still another embodiment, the manufacturing method 1100 further comprises: coupling the first conducting portion 116A of the second conducting layer 116 to the first power device 120 via the connecting member L1.

In yet another embodiment, the above manufacturing method 1100 further comprises: forming the third conducting layer 111, forming the second insulating layer 113 on the third conducting layer 111, and forming the first conducting layer 112 on the second insulating layer 113. Additionally, the step of forming the second substrate 122 further comprises: forming the fourth conducting layer 117 of the second substrate 122, the first insulating layer 114 being disposed on the fourth conducting layer 117, wherein the fourth conducting layer 117 is connected to the first conducting layer 112 via the conductive connection material 115.

A description is provided with reference to FIG. 4. In yet another embodiment, the above manufacturing method 1100 further comprises: forming the third substrate 210, the third substrate 210 having the same structure as the first substrate 110; and forming the fourth substrate 222 above the third substrate 210, and the third substrate 210 and the fourth substrate 222 being connected via the conductive connection material 215, the fourth substrate 222 having the same structure as the second substrate 122.

In another embodiment, the above manufacturing method 1100 further comprises: forming the substrate carrier 160, wherein the first substrate 110 and the second substrate 122 are disposed above the substrate carrier 160, and the first substrate 110 is connected to the substrate carrier 160 via the conductive connection material 150. In addition, the step of forming the third substrate 210 and the fourth substrate 222 comprises: forming the third substrate 210 and the fourth substrate 222 above the substrate carrier 160, wherein the third substrate 210 is connected to the substrate carrier 160 via the conductive connection material 250, and the first substrate 110 and the third substrate 210 are connected via the conductive connection material 500. In another embodiment, the first controlling device 130 may be a capacitor, a diode clamping circuit, or an active clamping circuit. However, the present disclosure is not limited in this regard, and those of ordinary skill in the art may adopt suitable electronic devices selectively depending on practical needs.

A description is provided with reference to FIG. 5A and FIG. 11. In yet another embodiment, the step of forming the first conducting layer 112 comprises: forming the first conducting portion 112AI, the second conducting portion 112AII, and the third conducting portion 112AIII of the first conducting layer 112, wherein the first conducting portion 112AI, the second conducting portion 112AII, and the third conducting portion 112AIII of the first conducting layer 112 are separate from one another.

In another embodiment, the step of forming the first power device on the first conducting layer 112 comprises: forming the power device 170 on the first conducting portion 112AI of the first conducting layer 112, and coupling the power device 170 to the second conducting portion 112AII of the first conducting layer 112 via the connecting member L3. Additionally, the manufacturing method 1100 further comprises: forming the first power device 120 on the second conducting portion 112AII of the first conducting layer 112, and coupling the first power device 120 to the third conducting portion 112AIII of the first conducting layer 112 via the connecting member L2.

In yet another embodiment, the step of forming the second conducting layer 116 comprises: forming the first conducting portion 116A and the second conducting portion 116B of the second conducting layer 116, wherein the first conducting portion 116A and the second conducting portion 116B of the second conducting layer 116 are separate from each other. Additionally, the step of forming the first controlling device 130 on the second conducting layer 116 comprises: forming the first controlling device 130 on the first conducting portion 116A and the second conducting portion 116B of the second conducting layer 116. In another embodiment, the manufacturing method 1100 further comprises: coupling the first conducting portion 116A of the second conducting layer 116 to the first conducting portion 112AI of the first conducting layer 112 via the connecting member L4.

A description is provided with reference to FIG. 6A. In still another embodiment, the above manufacturing method 1100 further comprises: forming the first driving circuit 180 on the first conducting portion 116A of the second conducting layer 116, and the first driving circuit 180 being independent of the first controlling device 130; and forming the second driving circuit 190 on the second conducting portion 116B of the second conducting layer 116, and the second driving circuit 190 being independent of the first controlling device 130.

Those of ordinary skills in the art will appreciate that each of the steps of the manufacturing method 1100 for the power module packaging structure named after the function thereof is merely used to describe the technology in the embodiment of the present disclosure in detail, but the manufacturing method 1100 is not limited in this regard. Therefore, combining the steps of said method into one step, dividing the steps into several steps, or rearranging the order of the steps is within the scope of the embodiment in the present disclosure.

In view of the foregoing embodiments of the present disclosure, many advantages of the present disclosure are now apparent. The embodiments provide a power module packaging structure and a method for manufacturing the same, which reduces the parasitic inductance of the power module packaging structure to reduce the voltage spike which is generated in the power module packaging structure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A power module packaging structure comprising:
   a first conducting layer;
   a first insulating layer disposed above the first conducting layer;
   a second conducting layer disposed above the first insulating layer;
   a first power device disposed on the first conducting layer; and
   a first controlling device disposed on the second conducting layer and used for controlling the first power device;
   wherein the first conducting layer, the second conducting layer, the first power device, and the first controlling device form a loop, a direction of a current that flows through the first conducting layer in the loop is opposite to a direction of a current that flow through the second conducting layer in the loop.

2. The power module packaging structure of claim 1, wherein a thickness of the first insulating layer is 25 micrometers (um) to 1 millimeter (mm).

3. The power module packaging structure of claim 1, wherein a ratio of an area of a vertical projection of the second conducting layer onto the first conducting layer to an area of the second conducting layer is greater than 50%.

4. The power module packaging structure of claim 1, wherein the second conducting layer is coupled to the first conducting layer via a conducting member.

5. The power module packaging structure of claim 4, wherein the first power device is coupled to the first conducting layer via a first connecting member;
   wherein the power module packaging structure further comprises:
   a second power device disposed on the first conducting layer, and coupled to the first conducting layer via a second connecting member.

6. The power module packaging structure of claim 5, further comprising:
   a first driving circuit and a second driving circuit disposed on the second conducting layer and being independent of the first controlling device.

7. The power module packaging structure of claim 4, further comprising:
   a second controlling device disposed on the second conducting layer and being coupled to the second conducting layer via a third connecting member.

8. The power module packaging structure of claim 1, further comprising a substrate, the substrate comprising the first conducting layer, the first insulating layer, and the second conducting layer.

9. The power module packaging structure of claim 8, wherein the substrate further comprises.
   a third conducting layer; and
   a second insulating layer disposed on the third conducting layer;
   wherein the first conducting layer is disposed on the second insulating layer.

10. The power module packaging structure of claim 1, further comprising a first substrate and a second substrate, wherein the second substrate is disposed above the first substrate, and the first substrate and the second substrate being connected via conductive connection material; wherein the first substrate comprises the first conducting layer, and the second substrate comprises the second conducting layer and the first insulating layer.

11. The power module packaging structure of claim 10, wherein the first substrate further comprise:
    a third conducting layer; and
    a second insulating layer disposed on the third conducting layer, and the first conducting layer being disposed on the second insulating layer;
    wherein the second substrate further comprises:
    a fourth conducting layer, the first insulating layer being disposed on the fourth conducting layer, wherein the fourth conducting layer is connected to the first conducting layer via conductive connection material.

12. The power module packaging structure of claim 11 further comprising:
    a third substrate and a fourth substrate, the fourth substrate being disposed above the third substrate, and the third substrate and the fourth substrate being connected via conductive connection material, wherein the third substrate has a same structure as the first substrate, and the fourth substrate has a same structure as the second substrate.

13. The power module packaging structure of claim 12, further comprising a substrate carrier, the first substrate and the second substrate being disposed above the substrate carrier, the first substrate being connected to the substrate carrier via conductive connection material;
    the third substrate and the fourth substrate being disposed above the substrate carrier, and the third substrate being connected to the substrate carrier via a conductive connection material;
    wherein the first substrate and the third substrate are connected via conductive connection material.

14. A manufacturing method for a power module packaging structure comprising:
- forming a first conducting layer;
- forming a first insulating layer above the first conducting layer;
- forming a second conducting layer above the first insulating layer;
- forming a first power device on the first conducting layer;
- forming a first controlling device on the second conducting layer, wherein the first controlling device is used for controlling the first power device; and
- making the first conducting layer, the second conducting layer, the first power device, and the first controlling device form a loop, wherein a direction of a current that flows through the first conducting layer in the loop is opposite to a direction of a current that flows through the second conducting layer in the loop.

15. The manufacturing method for the power module packaging structure of claim 14, wherein a thickness of the first insulating layer is 25 micrometers (um) to 1 millimeter (mm).

16. The manufacturing method for the power module packaging structure of claim 14, wherein a ratio of an area of a vertical projection of the second conducting layer onto the first conducting layer to an area of the second conducting layer is greater than 50%.

17. The manufacturing method for the power module packaging structure of claim 14, further comprising:
- coupling the first conducting layer to the second conducting layer via conducting member.

18. The manufacturing method for the power module packaging structure of claim 14, further comprising:
- forming a substrate, wherein the substrate comprises the first conducting layer, the first insulating layer, and the second conducting layer.

19. The manufacturing method for the power module packaging structure of claim 14, further comprising:
- forming a first substrate, wherein the first substrate comprises the first conducting layer; and
- forming a second substrate above the first substrate, wherein the second substrate comprises the second conducting layer and the first insulating layer.

20. The manufacturing method for the power module packaging structure of claim 19, further comprising:
- forming a third conducting layer; and
- forming a second insulating layer on the third conducting layer, and forming the first conducting layer on the second insulating layer;
- wherein the step of forming the second substrate further comprises:
  - forming a fourth conducting layer of the second substrate, wherein the first insulating layer is disposed on the fourth conducting layer, wherein the fourth conducting layer is connected to the first conducting layer via conductive connection material.

21. The manufacturing method for the power module packaging structure of claim 20, further comprising:
- forming a third substrate, wherein the third substrate has a same structure as the first substrate; and
- forming a fourth substrate above the third substrate, and the third substrate and the fourth substrate being connected via conductive connection material, wherein the fourth substrate has a same structure as the second substrate.

22. The manufacturing method for the power module packaging structure of claim 21 further comprising:
- forming a substrate carrier, wherein the first substrate and the second substrate are disposed above the substrate carrier, and the first substrate is connected to the substrate carrier via conductive connection material;
- wherein the step of forming the third substrate and the fourth substrate comprises:
  - forming the third substrate and the fourth substrate above the substrate carrier, wherein the third substrate is connected to the substrate carrier via conductive connection material, wherein the first substrate and the third substrate are connected via conductive connection material.

23. The manufacturing method for the power module packaging structure of claim 22, further comprising:
- printing solder paste on the second conducting layer to attach the first controlling device and a second controlling device to the second conducting layer, and soldering the first controlling device and the second controlling device to the second conducting layer through reflow soldering;
- printing solder paste on the first substrate and soldering the fourth conducting layer and the first power device to the first substrate through reflow soldering;
- coupling the second controlling device to the second conducting layer and coupling the first power device to the second conducting layer via a plurality of connecting members;
- printing a solder material on the substrate carrier, fixing the first substrate and the third substrate to the substrate carrier by using a jig, and soldering the first substrate and the third substrate to the substrate carrier through reflow soldering; and
- connecting the first substrate to the third substrate via conductive connection material.

* * * * *